(12) United States Patent
Wong

(10) Patent No.: US 6,440,783 B2
(45) Date of Patent: Aug. 27, 2002

(54) METHOD FOR FABRICATING A THIN FILM TRANSISTOR DISPLAY

(75) Inventor: Jia-Fam Wong, Hsin-Chu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 09/848,361

(22) Filed: May 4, 2001

(30) Foreign Application Priority Data

Aug. 4, 2000 (TW) ......................................... 89115670 A

(51) Int. Cl.[7] .................... H01L 21/30; H01L 21/46; H01L 21/8238; H01L 21/3205
(52) U.S. Cl. .................... 438/155; 438/200; 438/585; 438/591
(58) Field of Search ................. 438/149, 151, 438/153, 154, 155, 200, 210, 585, 591

(56) References Cited

U.S. PATENT DOCUMENTS 5,756,372 A * 5/1998 Wakui et al. ............... 438/30
6,207,480 B1 * 3/2002 Cha et al. ................. 438/149
2002/0038893 A1 * 4/2002 Wong ........................ 257/359
2002/0048866 A1 * 4/2002 Wong ........................ 438/155

\* cited by examiner

Primary Examiner—Richard Booth
Assistant Examiner—Viktor Simkovic
(74) Attorney, Agent, or Firm—Winston Hsu

(57) ABSTRACT

A thin film transistor display is formed on a substrate having a first region and a second region. The first region includes a transistor area, and the second region includes a pad area. A gate electrode is first formed in the transistor area, and a pad electrode is formed in the pad area. An insulating layer, a semiconductor layer, and a doped silicon layer are formed on the substrate. An opening is formed in the pad area to expose the pad electrode. A channel is defined in the transistor area. A source and a drain electrode are formed and are separated by the channel. The substrate is exposed at a first side area of the first region and exposed in the second region except the pad area.

6 Claims, 11 Drawing Sheets

METHOD FOR FABRICATING A THIN FILM TRANSISTOR DISPLAY

BACKGROUND OF THE INVENTION

1. Field of the Invention

The present invention relates to a method for fabricating a thin film transistor display.

2. Description of the Prior Art

In a thin film transistor display, especially referring to a thin film transistor liquid crystal display (TFT-LCD), a lot of thin film transistors are arranged in a matrix as switches for driving liquid crystal molecules to produce brilliant images after co-operating with other elements such as capacitors and bonding pads. The advantages of the TFT-LCD include the portability, low power consumption, and low radiation. Therefore, the TFT-LCD is widely used in various portable products, such as notebooks, personal data assistants (PDA), etc. Moreover, the TFT-LCD replaces the CRT monitor in desktop computers gradually.

Please refer to FIG. 1A to FIG. 1E. FIG. 1A to FIG. 1E are schematic diagrams of a prior art method for fabricating a thin film transistor display 10, such as a thin film transistor liquid crystal display (TFT-LCD) 10. The TFT-LCD 10 is formed on the surface of a substrate 12. The surface of the substrate 12 comprises a transistor area 14 for forming a transistor 20.

As shown in FIG. 1A, in the process of forming the TFT-LCD 10, a metal layer (not shown) is deposited on the surface of the substrate 12 followed by the patterning of the metal layer to form a gate electrode 26 in the transistor area 14. Subsequently, as shown in FIG. 1B, an insulating layer 28, an amorphous silicon layer 30, and a doped silicon layer 32 are formed on the substrate 12, respectively. As shown in FIG. 1C, the doped silicon layer 32, the amorphous silicon layer 30, and the insulating layer 28 outside of the transistor area 14 are removed. As shown in FIG. 1D, an indium tin oxide (ITO) layer 36 is deposited on the surface of the substrate 12. Then, as shown in 1E, the pattern of the ITO layer 36 is formed, and a part of the doped silicon layer 32 in the transistor area 14 is removed to form a source electrode 38 and a drain electrode 40.

The prior art method mentioned above needs only three masks to save the fabricating time. However, in order to reduce the manufacturing time, the ITO layer 36 with a high resistance is used to replace the metal layer as the electrical connecting lines. Consequently, the driving voltage of the display is increased, and the method is hard to apply to fabricate the display with large area.

Besides, in order to satisfy the dynamic images and multimedia applications, the thin film transistor display of the future must be brighter, have a high response rate, and a wide viewing angle. So, it is necessary to increase production yields and reduce costs by improving the materials or the fabricating processes of the display.

SUMMARY OF THE INVENTION

It is therefor an objective of the present invention to provide a method for fabricating a thin film transistor (TFT) display. The method is used to decrease the number of the mask, and reduce the resistance of the electrical elements in the display as well. The method can be applied to manufacture an in-plan switch (IPS) type TFT liquid crystal display.

In a preferred embodiment, the present invention provides a method for fabricating a thin film transistor display. The thin film transistor display is formed on a substrate. A first region and a second region are defined on the substrate. The first region includes a transistor area and the second region includes a pad area. A first metal layer is deposited and patterned on the substrate to form a gate electrode in the transistor area and a pad electrode in the pad area. An insulating layer and a semiconductor layer are deposited on the substrate, and an etching stopper is formed and patterned above the semiconductor layer. Then, a doped silicon layer is deposited on the semiconductor layer and the etching stopper. An opening area is defined in the pad area. Moreover, removing the insulating layer, the semiconductor layer, and the doped silicon layer positioned (a) outside the transistor area of the first region and (b) outside the pad area (c) within the opening area of the second region. The substrate is then exposed in the regions outside the transistor area and the pad area. An opening is formed in the pad area to expose the pad electrode. Further, a second metal layer is formed to cover the transistor area and the pad area, and the second metal in the opening is electrically connected to the pad electrode. The second metal layer is patterned. A channel area is defined in the transistor area, and then removing the second metal layer positioned (a) in the channel area of the first region, (b) outside a first side area of the first region, and (c) in the second region except the pad area. The doped silicon layer is then patterned to form a source electrode and a drain electrode in the transistor area by utilizing the left second metal layer as a mask. The source and drain electrodes are separated by the channel area. Therefore, the substrate will be exposed in the first side area of the first region and exposed in the second region except the pad area.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1A:
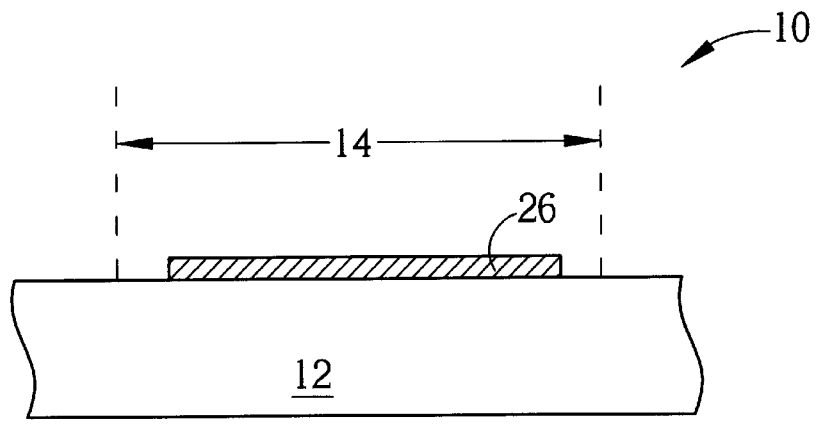
FIGS. 1A to 1E are schematic diagrams of a prior art for fabricating a thin film transistor display.
Figure 1B:
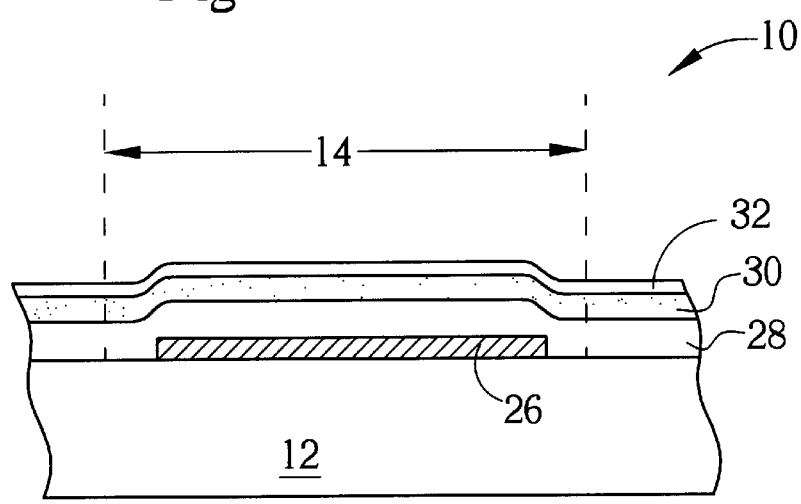
Figure 1C:
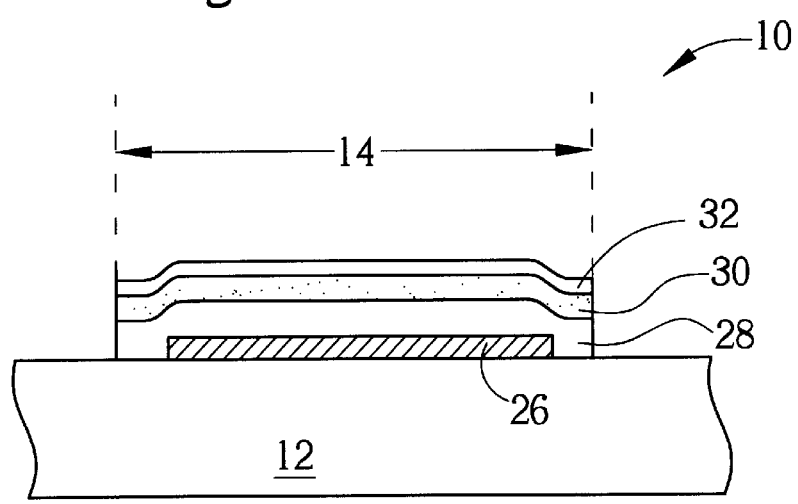
Figure 1D:
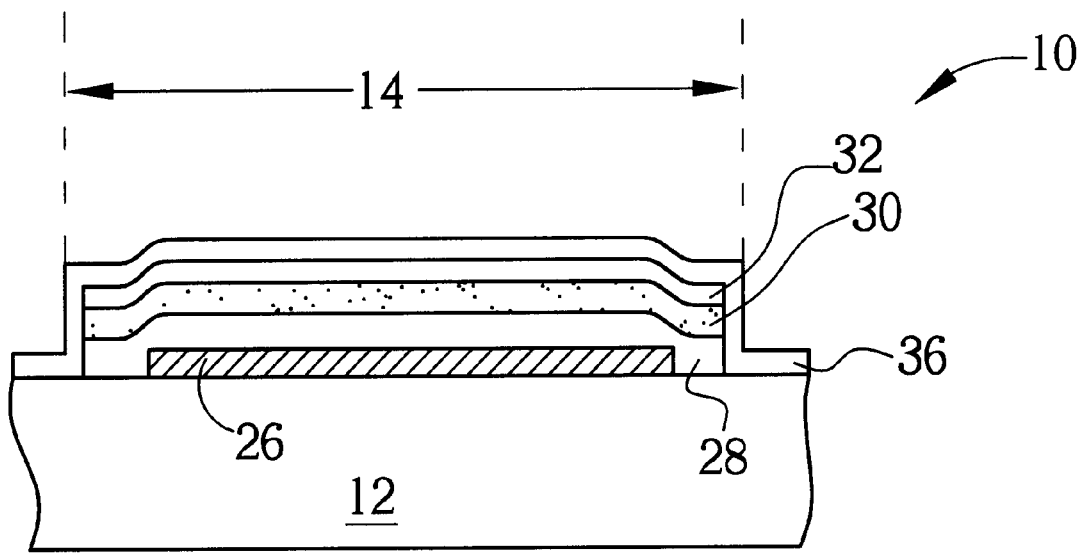
Figure 1E:
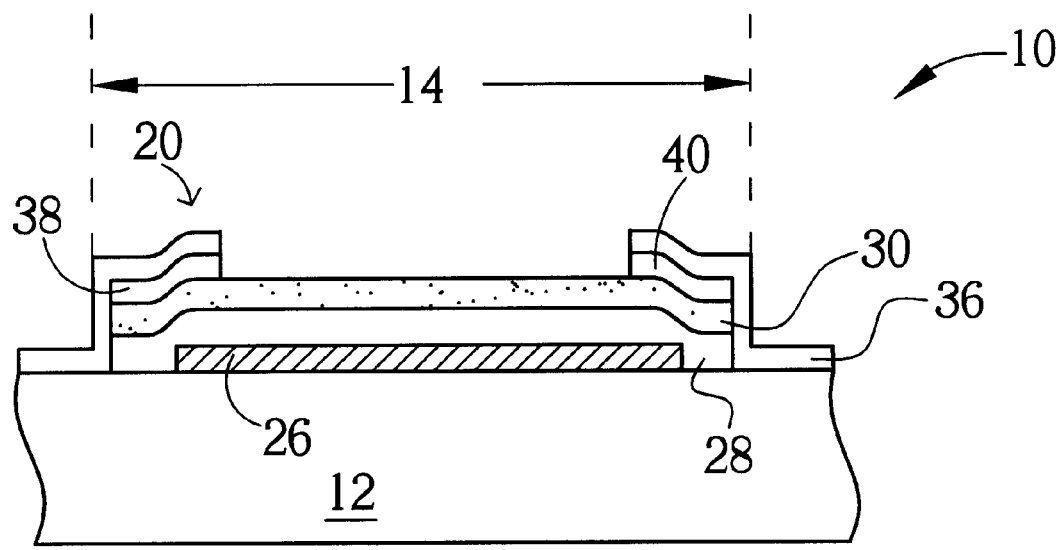

Please refer to FIG. 2A to FIG. 2G, which are schematic diagrams of a method for fabricating a thin film transistor display 50 according to the present invention. The processes shown in FIG. 2A to FIG. 2E can also be used for manufacturing an in-plan switch (IPS) type display. According to the present invention, the display 50 is formed on the surface of a substrate 52. The surface of the substrate 52 includes a first region I, a second region II, and a capacitor area 56. The first region I includes a transistor area 54 for forming a transistor 60 and the second region II includes a pad area 58 for forming a pad 64.

Figure 2A:
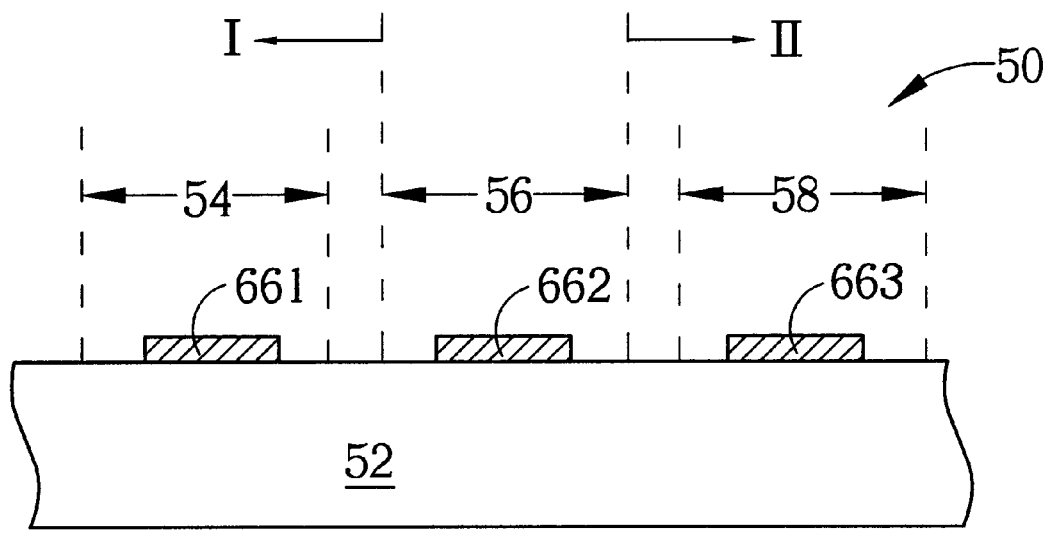
FIGS. 2A to 2H are schematic diagrams of the present invention for fabricating a thin film transistor display.

In the present invention, the first step in the method for manufacturing a thin film transistor display 50 is to deposit a metal layer (not shown) on the substrate 52. The metal layer is then patterned to form at least a gate electrode 661 in the transistor area 54, a capacitor bottom electrode 662 in the capacitor area 56, and a pad electrode 663 in the pad area 58, as shown in FIG. 2A.

Figure 2B:
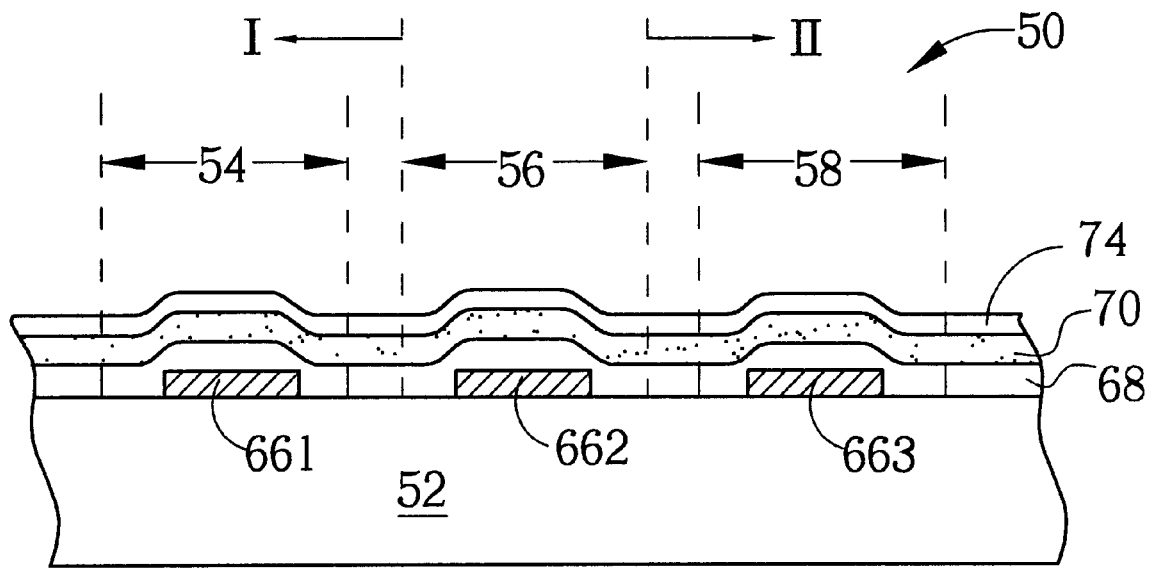

As shown in FIG. 2B, an insulating layer 68, a semiconductor layer 70, and a doped silicon layer 74 are sequentially deposited on the substrate 52. The semiconductor layer 70 can be a poly-silicon layer or an amorphous silicon layer, depending on the condition of the manufacturing process or the requirement of the display.

Figure 2C:
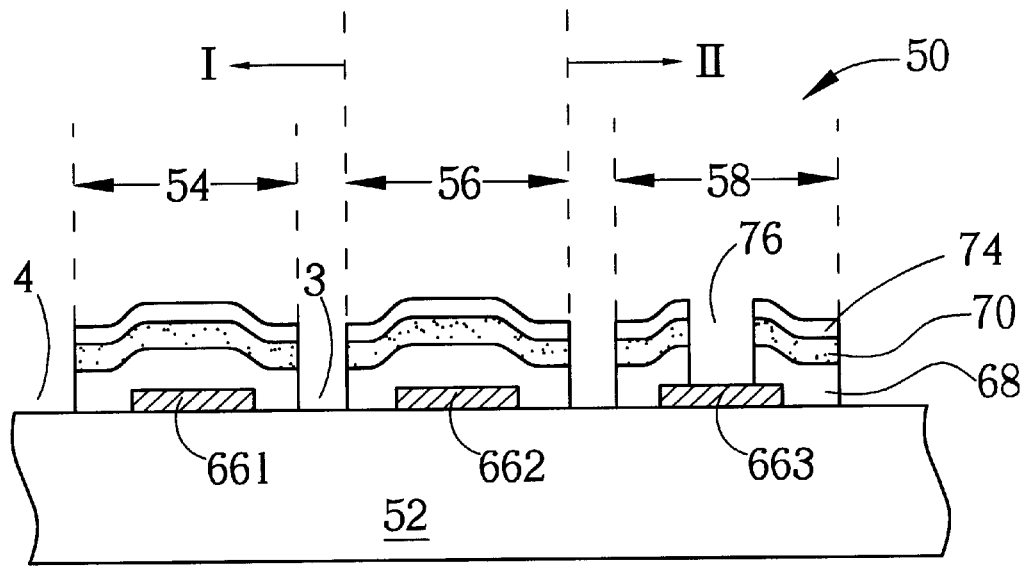

As shown in FIG. 2C, an opening area is defined in the pad area 58. The insulating layer 68, the semiconductor layer 70 and the doped silicon layer 74 are removed from areas: (a) outside of the transistor area 54 of the first region I, (b) the capacitor area 56 and the second region II except the pad area 58, and (c) within the opening area. The substrate 52 is thus exposed except the transistor area 54, the capacitor area 56, and the pad area 58. Furthermore, an opening 76 is formed in the pad area 58 and the pad electrode 663 is exposed in the opening 76. Besides, the first region I includes a first side area 3 and a second side area 4.

Figure 2D:
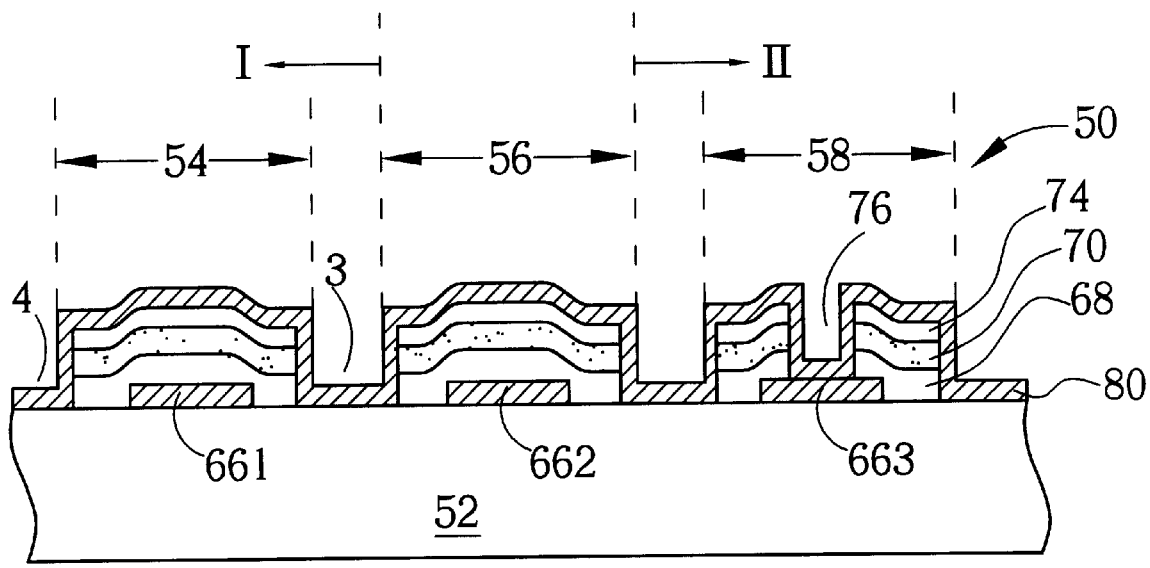
Figure 2E:
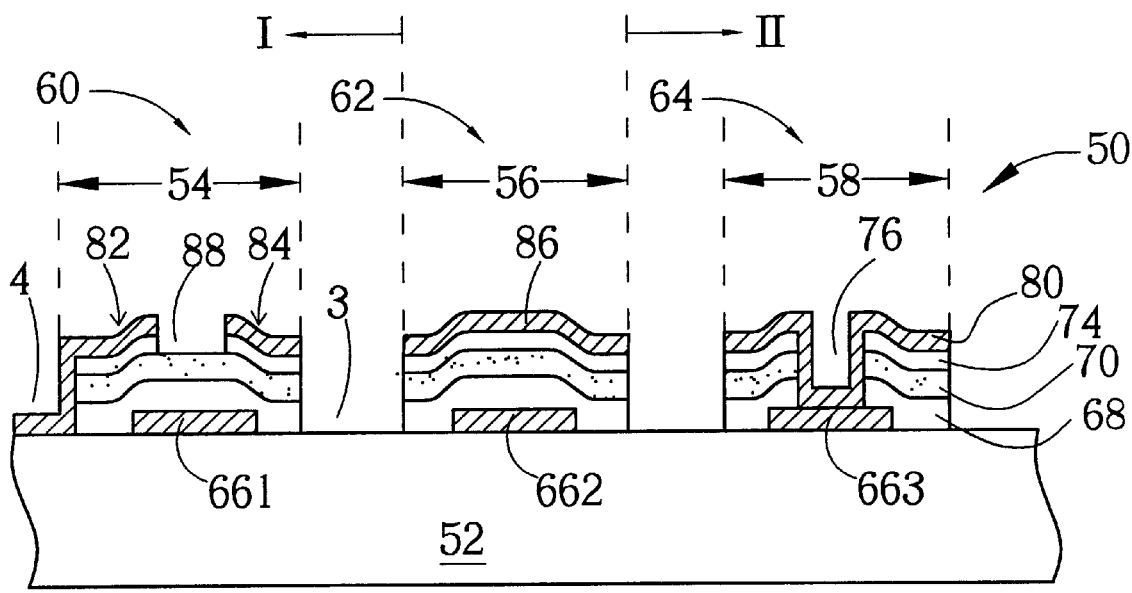

As shown in FIG. 2D, a second metal layer 80 is deposited on the substrate 52 and covers the opening 76. As shown in FIG. 2E, the second metal layer 80 is patterned, and a channel area 88 is defined in the transistor area 54. The second metal layer 80 is removed from (a) the channel area 88 of the first region I, (b) the first side area 3 of the first region I, (c) outside of the capacitor area 56, and (d) the second region II except the pad area 58. Further, the doped silicon layer 74 is patterned by utilizing the left second metal layer 80 as a mask to form the source electrode 82 and the drain electrode 84 in the transistor area 54. A channel 88 is formed between the source electrode 82 and the drain electrode 84. The semiconductor layer 70 is then exposed in the channel 88. A capacitor top electrode 86 is also formed in the capacitor area 56. Finally, the substrate 52 is exposed except in the transistor area 54 and the second side area 4 of the first region I, the capacitor area 56, and the pad area 58 of the second region II.

Consequently, the fabrications of the transistor 60, the capacitor 62, and the pad 64 are completed. These electrical elements can be used in an in-plan switch (IPS) type thin film transistor display. Additionally, a protective layer (not shown) is also formed on the substrate 52 if necessary, which protects the semiconductor layer 70 in the channel area 88 from oxidizing during other thermal processes. Alternatively, a partial oxidation can be performed to oxidize the surface of the semiconductor layer 70 in the channel area 88, so that the protective layer is unnecessary, and the reliability of the transistor is maintained.

Figure 2F:
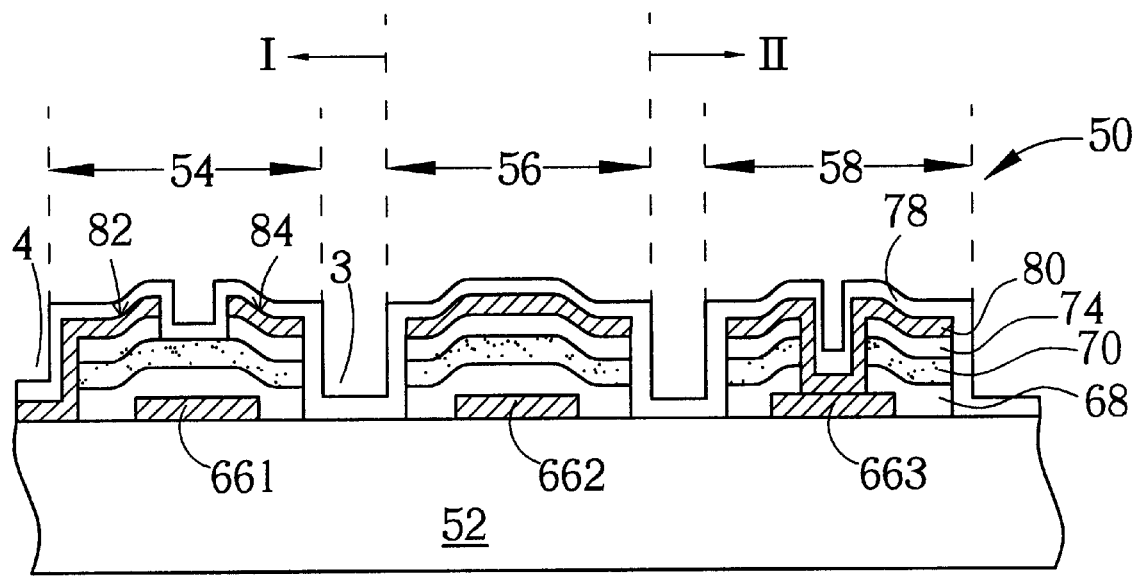
Figure 2G:
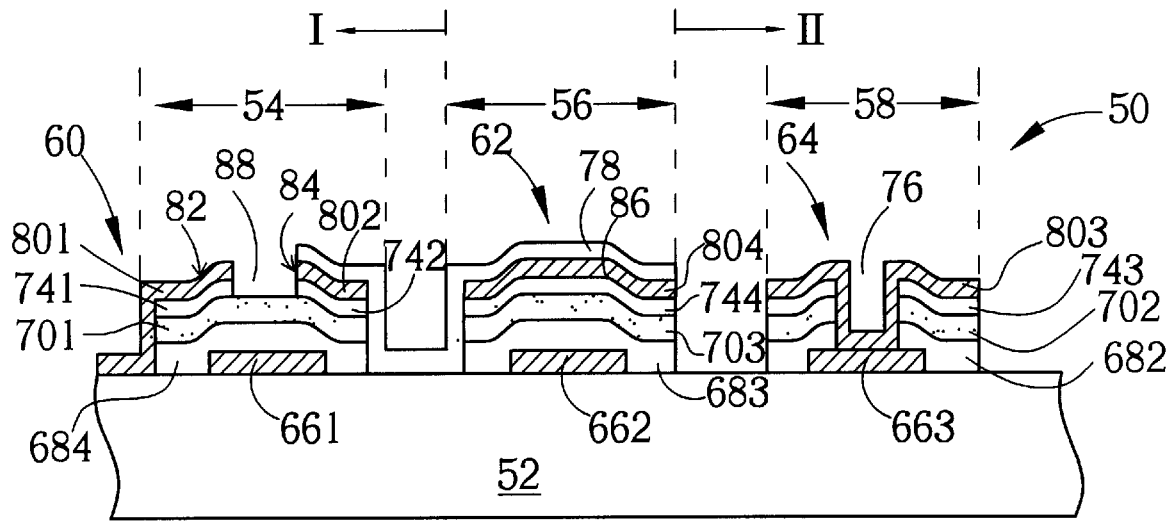

The processes shown in FIG. 2A to FIG. 2G are used for the fabrication of a general thin filmtransistor display. As shown in FIG. 2F, a transparent conductive layer 78 is deposited on the substrate 52. The transparent conductive layer 78 is usually made by an indium tin oxide layer. As shown in FIG. 2G, the transparent conductive layer 78 is patterned to remain on the drain electrode 84, the capacitor top electrode 86, and the substrate 52 between the transistor area 54 and the capacitor area 56. As a result, the electrical elements for a general thin film transistor display are manufactured. Further, a protective layer (not shown) is formed on the substrate 52 for protecting the semiconductor layer 70 exposed in the channel area 88 from oxidizing during other thermal processes.

Please refer to FIGS. 3A to 3I, which are schematic diagrams of a second embodiment of the present invention. The processes shown in FIG. 3A to FIG. 3G are used for manufacturing the in-plan switch (IPS) type thin film transistor display. Besides, the processes shown in FIG. 3A to FIG. 3I are used for manufacturing of a general thin film transistor display.

In FIG. 3A to FIG. 3G, the same numbers represent the same structures as those in the first embodiment. The most difference between the second embodiment and the first embodiment is the etching stopper. It is not easy to control the end point of the etching process of the doped silicon layer because the materials of the semiconductor layer and the doped silicon layer are very similar. Hence, over-etching often occurs to remove a part of the semiconductor layer, the performance of the transistor will be affected. An etching stopper is thus formed above the semiconductor layer to overcome this problem.

Figure 3A:
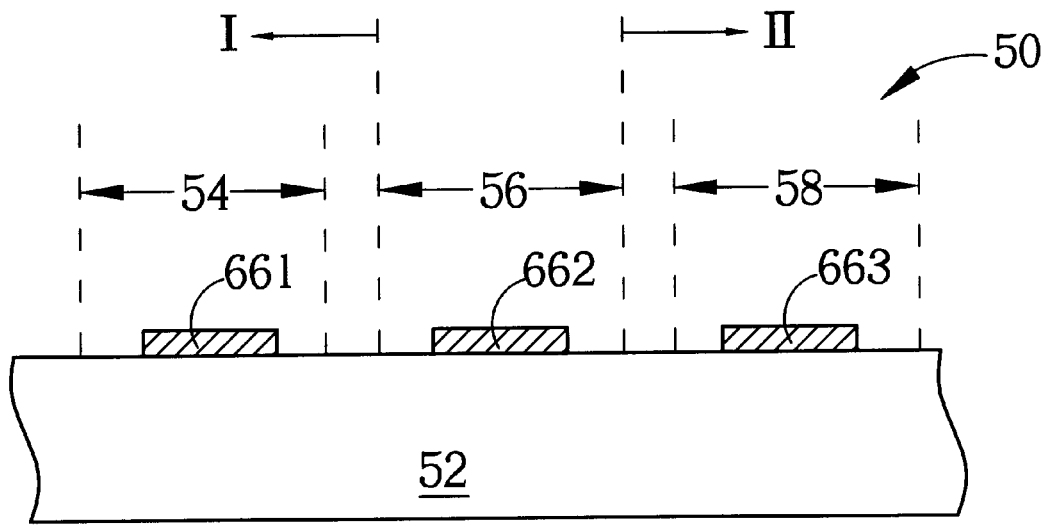
FIGS. 3A to 3J are schematic diagrams of a second embodiment of the present invention.

In the second embodiment, a metal layer (not shown) is first formed on the surface of the substrate 52. The metal layer is then patterned to form a gate electrode 661 in the transistor area 54, a capacitor bottom electrode 662 in the capacitor area 56, and a pad electrode 663 in the pad area 58, as shown in FIG. 3A.

Figure 3B:
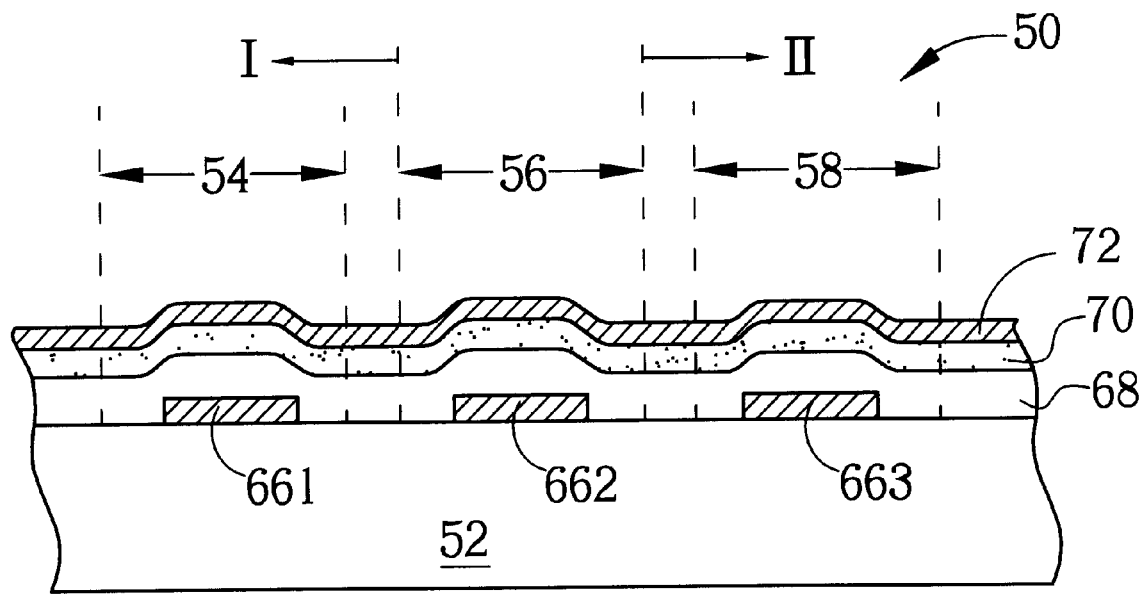
Figure 3C:
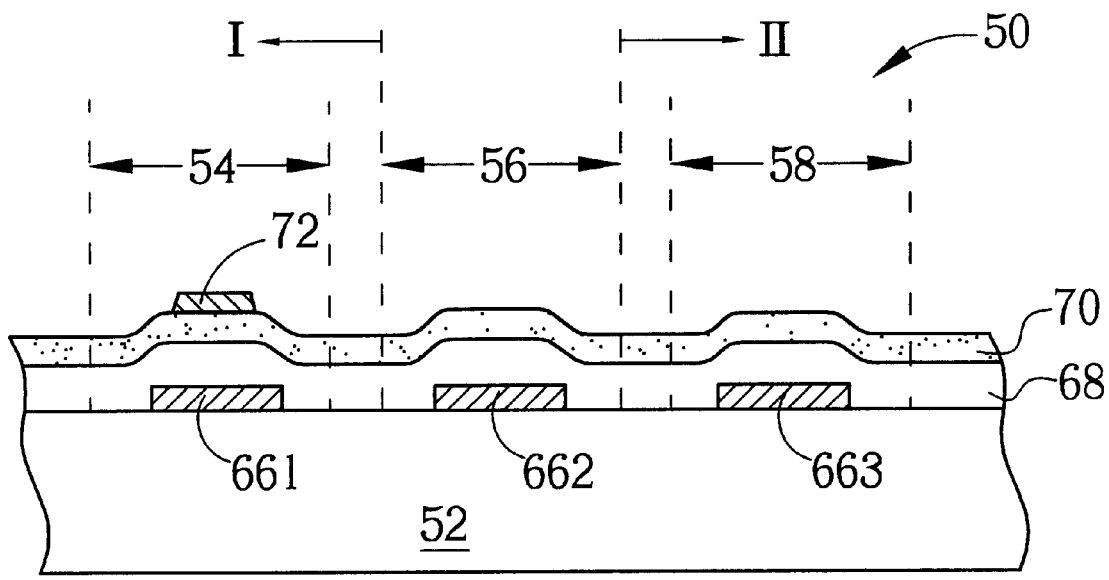
Figure 3D:
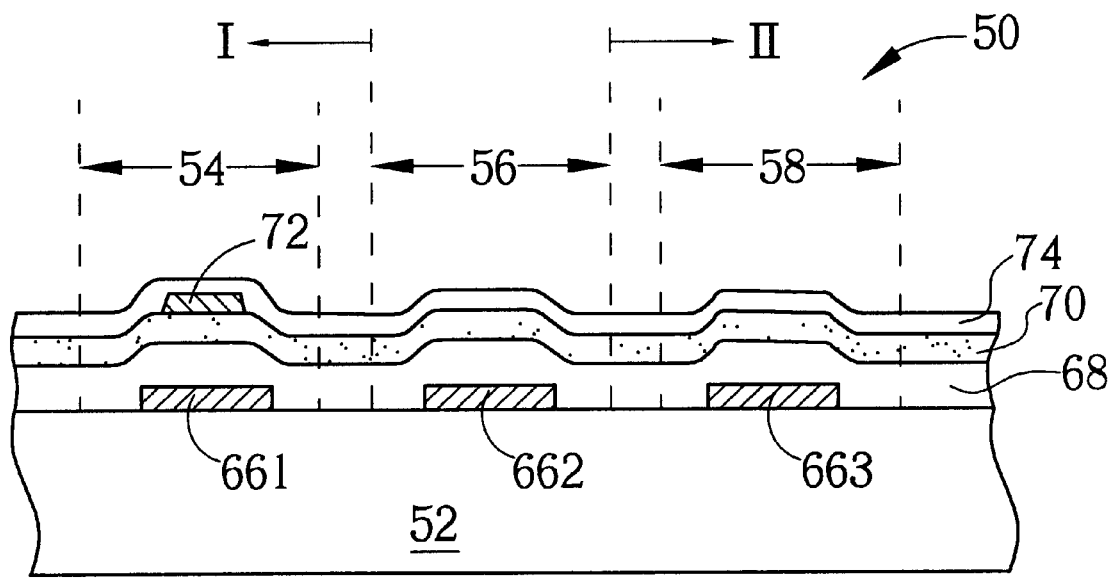
Figure 3E:
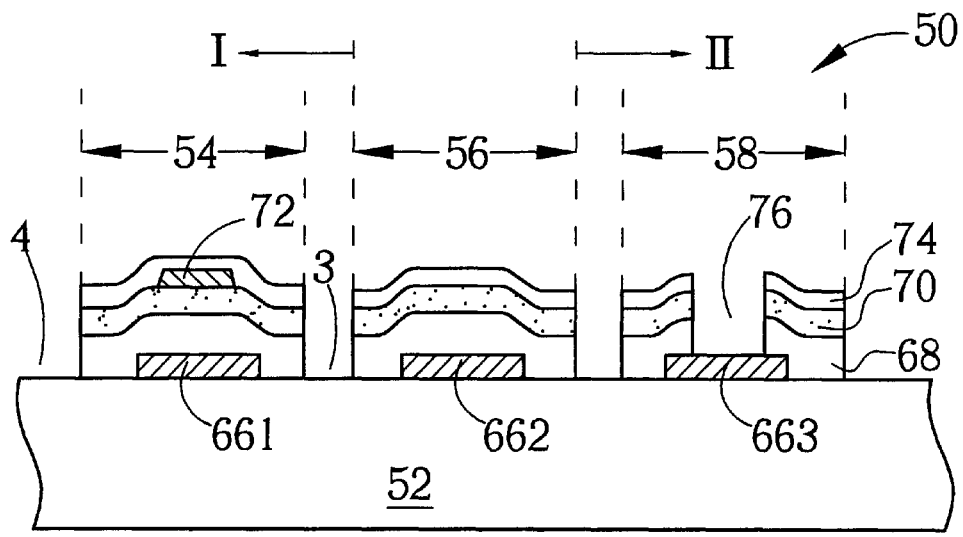

As shown in FIG. 3B, an insulating layer 68, a semiconductor layer 70, and an etching stopper layer are deposited on the substrate 52. The etching stopper layer is made of an insulating material to prevent the semiconductor layer 70 from being etched in a subsequent etching process. Then, as shown in FIG. 3C, the etching stopper 72 is formed in the transistor area 54. As shown in FIG. 3D, a doped silicon layer 74 is deposited on the semiconductor layer 70 and the etching stopper 72. Further, an opening area is defined in the pad area 58. The insulating layer 68, the semiconductor layer 70, and the doped silicon layer 74 positioned (a) outside the transistor area 54 of the first region I, (b) outside the pad area 58 of the second region II, (c) outside the capacitor area 56, and (d) in the opening area are all removed. Therefore, the substrate 52 is exposed in the areas except the transistor area 54, the capacitor area 56, and the pad area 58 as shown in FIG. 3E. An opening 76 is also formed to expose the pad electrode 663. The first region I includes a first side area 3 and a second side area 4.

Figure 3F:
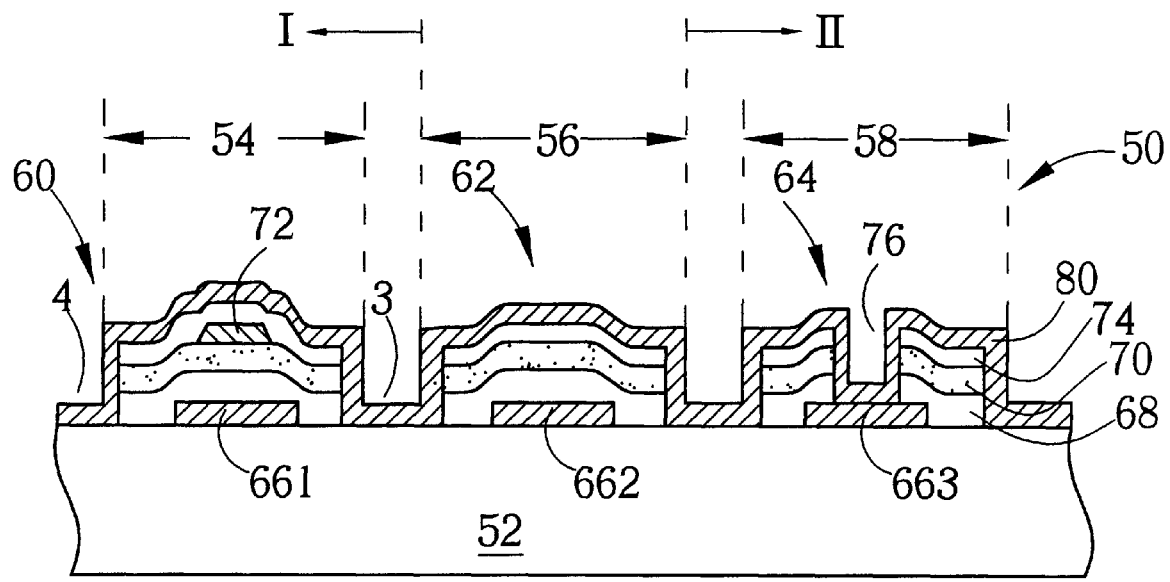
Figure 3G:
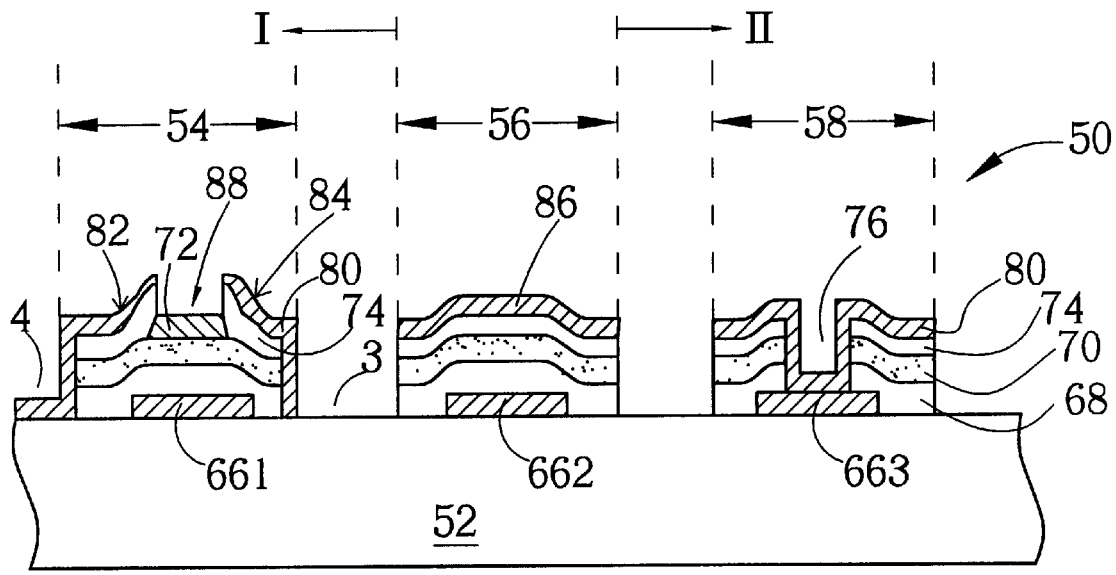

As shown in FIG. 3F, a metal layer 80 is deposited above the substrate 52 and the inside of the opening 76. As shown in FIG. 3G, the metal layer 80 is patterned, and a channel 88 is defined in the transistor area 54. Further, removing the metal layer 80 positioned (a) in the channel 88 and in the first side area 3 of the first region I, and (b) outside of the capacitor area 56 and the pad area 58. The doped silicon layer 74 is then patterned to form the source/drain electrodes by utilizing the metal layer 80 as a mask in the transistor area 54. The source electrode 82 and the drain electrode 84 are spaced by the channel 88, and the etching stopper 72 is exposed in the channel 88. A capacitor top electrode 86 is also formed in the capacitor area 56. The substrate 52 is then exposed in the areas except (a) the transistor area 54 and the second side area 4 of the first region I, (b) the capacitor area 56, and (c) the pad area 58 of the second region II.

After this step, the fabrication of the transistor 60, the capacitor 62, and the pad 64 is completed, and these electrical elements can be used in an in-plan switch (IPS) type thin film transistor display. Besides, a protective layer (not shown) may further be formed above the substrate 52 for protecting these electrical elements from oxidizing during other thermal processes.

Figure 3H:
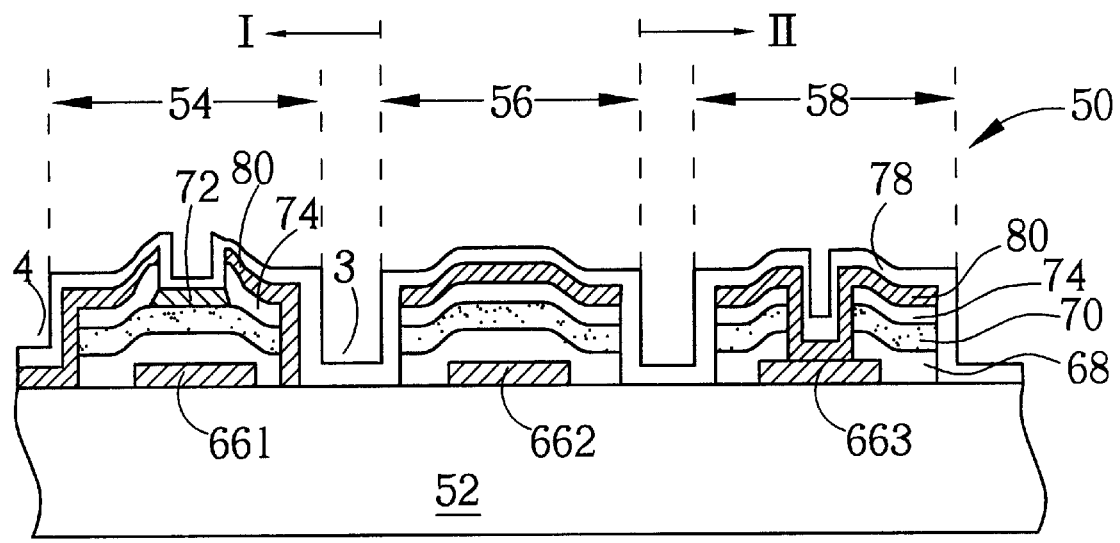
Figure 3I:
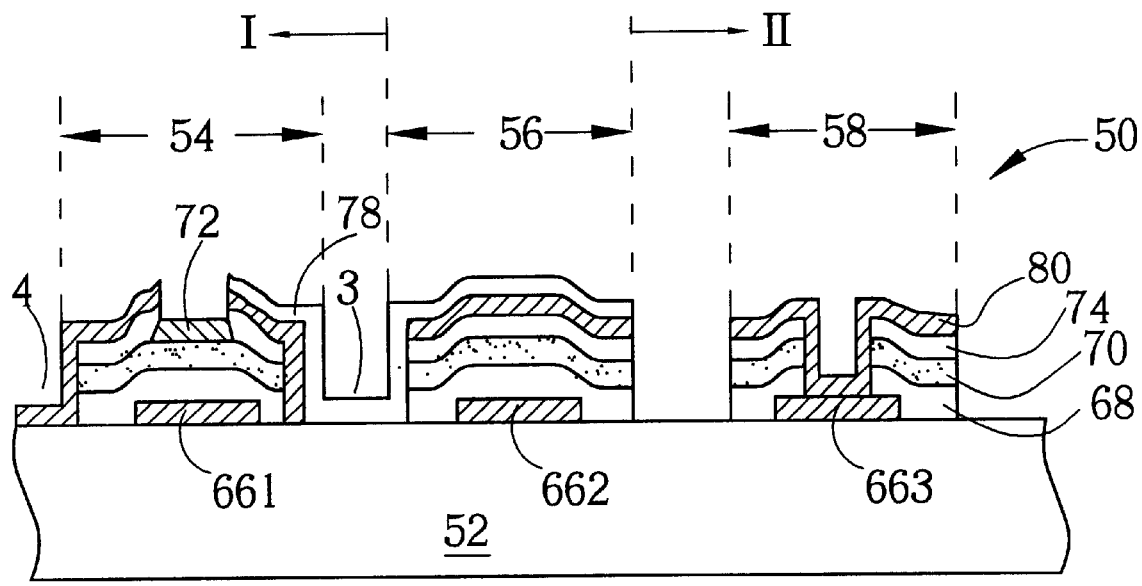

The processes shown in FIG. 3A to FIG. 3I are used for manufacturing a general thin film transistor display. As shown in FIG. 3H, a transparent conductive layer 78 is deposited on the substrate 52 after the structure shown in FIG. 3G is formed. The transparent conductive layer 78 usually refers to an indium tin oxide layer. As shown in FIG. 3I, the pattern of the transparent conductive layer 78 is defined so that the transparent conductive layer 78 lies on the drain electrode 84, the capacitor top electrode 86, and the surface of the substrate 52 between the transistor area 54 and the capacitor area 56. The fabrication of the transistor 60, the capacitor 62 and the pad 64 for a general thin film transistor display is then completed. Additionally, a protective layer (not shown) may also be formed on the substrate 52 to protect these elements from oxidizing during other thermal processes.

The first embodiment of the present invention discloses the structure of a thin film transistor (TFT) display 50. As shown in FIG. 2G, the structure of the TFT display 50 comprises a substrate 52, a thin film transistor 60, and a gate pad 64. The thin film transistor 60 includes a gate electrode 661 disposed on the substrate 52, a transistor insulating layer 684 and a transistor semiconductor layer 741 are sequentially formed on the gate electrode 661. A first doped silicon layer 741 and a second doped silicon layer 742 are disposed on the transistor semiconductor layer 701. A channel 88 is formed between the first and the second doped silicon layers. In addition, a source electrode 801 is formed on the first doped silicon layer 741, and a drain electrode 802 is formed on the second doped silicon layer 742.

Figure 2H:
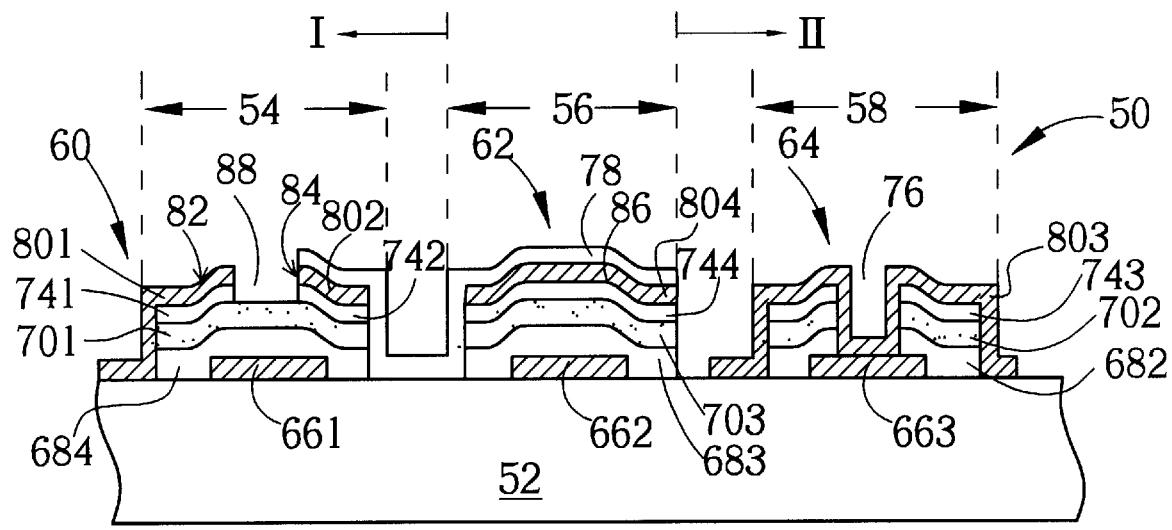

The gate pad 64 is defined in the pad area 58 and comprises a pad electrode 663, a pad insulating layer 682, a pad semiconductor layer 702, a third doped silicon layer 743, and a metal layer 803. The pad electrode 663 is formed on the substrate 52 and is electrically connected to the gate electrode 661. The pad insulating layer 682, the pad semiconductor layer 702, and the third doped silicon layer 743 surround the pad electrode 663 to form a pad opening 76. The pad opening 76 penetrates through the pad insulating layer 682, the pad semiconductor layer 702, and the third doped silicon layer 743. The metal layer 803 is formed inside the pad opening 76 and is electrically connected to the pad electrode 663. The metal layer 803 is aligned to the third doped silicon layer 743, and the pad semiconductor layer 702 is aligned to the pad insulating layer 682, as shown in FIG. 2G. The metal layer 803, as shown in FIG. 2H, may also cover the sides of the third doped silicon layer 743, the pad semiconductor layer 702, and the pad insulating layer 682.

Please refer back to FIG. 2G. The TFT display 50 further comprises a capacitor 62 positioned in the capacitor area 56. The capacitor 62 comprises a capacitor bottom electrode 662, an insulating layer 683, a semiconductor layer 703, a doped silicon layer 744, and a metal layer 804 sequentially formed on the capacitor bottom electrode 662. Additionally, a transparent conductive layer 78 is also formed on the metal layer 804 and the substrate 52 between the transistor area 54 and the capacitor area 56. The metal layer 804 is used as the capacitor top electrode, and the transparent conductive layer 78 is composed of indium tin oxide.

Figure 3J:
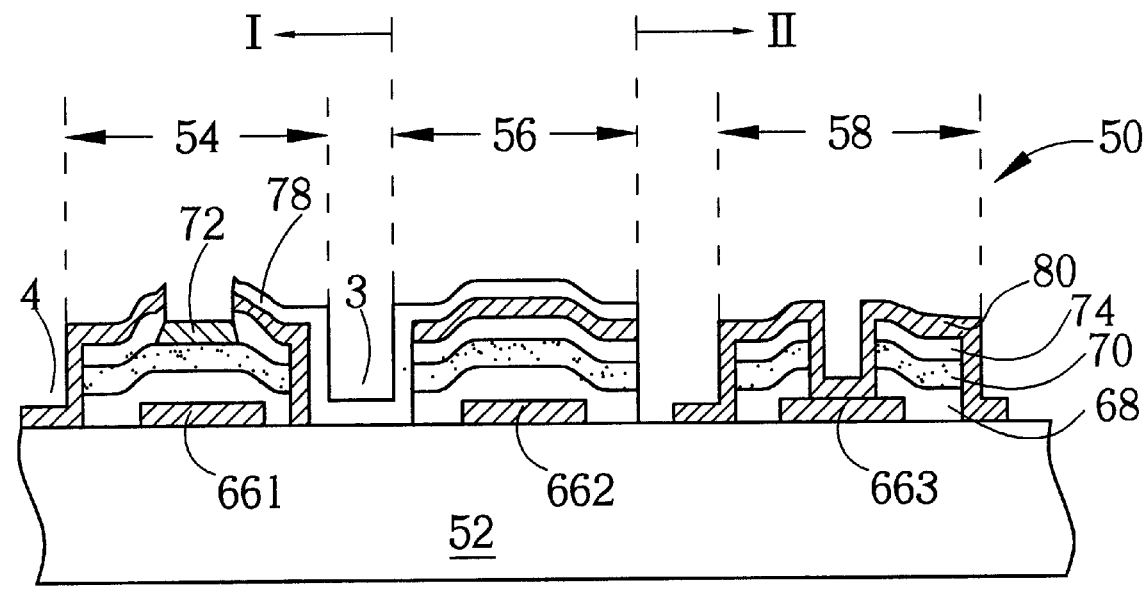

As shown in FIG. 3I and FIG. 3J, the second embodiment of the present invention further discloses another structure of a thin film transistor display. FIG. 3I and FIG. 3J are obviously distinguished from FIG. 2G and FIG. 2H by adding an etching stopper 72. The etching stopper 72 is disposed on the transistor semiconductor layer 70 and exposed in the channel 88. The other structures are the same as those of the first embodiment, and will not need to be repeated again.

One character of the present invention is to form an opening 76 in the pad area 58 while defining the pattern in the thin film transistor area 54, as shown in FIG. 2C and FIG. 3E. Another character of the present invention is to pattern the doped silicon layer 74 by using the metal layer 80 as a mask, as shown in FIG. 2E and FIG. 3G. Therefore, the second metal layer 80 and the doped silicon layer 74 have the same shape and are aligned with each other, no matter in the thin film transistor area 54 or in the pad area 58. Moreover, the semiconductor layer 70 and the insulating layer 68 have the same shape and are aligned with each other, in both of the thin film transistor area 54 and in the pad area 58. In addition, the metal layer 80 can cover the sides of the doped silicon layer 74, the semiconductor layer 70, and the insulating layer 68, as shown in FIG. 2H and FIG. 3J. An etching stopper 72 is used to control the end point during the etching process of the doped silicon layer 74 in the transistor area 54. The etching stopper 72 can prevent the over etching phenomenon happened at the semiconductor layer 70, and improve the performance of the transistor 60. The metal layer 80 is used to connect these electrical elements such that the resistance is reduced than the ITO material, and may be suitable to apply in large-area displays.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a thin film transistor display, the thin film transistor display being fabricated on a substrate, the substrate comprising a first region and a second region, the first region comprising a transistor area for forming at least one transistor, the second region comprising a pad area for forming at least one pad, the first region further comprising a first side area, the method comprising the steps of:

(1) depositing a first metal layer on the substrate;

(2) patterning the first metal layer to form a gate electrode in the transistor area and a pad electrode in the pad area;

(3) sequentially forming an insulating layer, a semiconductor layer, and a doped silicon layer on the substrate;

(4) defining an opening area in the pad area, and removing the insulating layer, the semiconductor layer, and the doped silicon layer positioned (a) except the transistor area of the first region, (b) except the pad area of the second region, and (c) within the opening area of the second region, an opening being formed in the pad area, the pad electrode being exposed in the opening, and the substrate thus being exposed in areas outside the transistor area and the pad area;

(5) depositing a second metal layer on the substrate to cover the transistor area and the pad area, and the second metal layer in the opening being electrically connecting to the pad electrode; and (6) patterning the second metal layer, defining a channel area in the transistor area, and first removing the second metal layer positioned (a) outside the first side area of the first region, (b) in the channel area of the first region, and (c) in the second region except the pad area, then patterning the doped silicon layer by utilizing the left second metal layer as a mask to form source/drain electrodes in the transistor area, the source and the drain electrodes being separated by the channel area, the substrate being exposed in the first side area of the first region and exposed in the second region except the pad area.

2. The method of claim 1 wherein the thin film transistor display is an in-plan switch (IPS) type display.

3. The method of claim 1 wherein the substrate further comprises a capacitor area to form a capacitor, the method for forming the capacitor comprising the steps of:

forming a bottom electrode of the capacitor in the capacitor area in the step (2) for patterning the first metal layer;

forming the insulating layer, the semiconductor layer, and the doped silicon layer in the capacitor area during the step (3), such that the substrate being exposed except at the transistor area, the capacitor area, and the pad area after the step (4); and depositing the second metal layer in the capacitor area at the step (5) to form a top electrode of the capacitor, such that the substrate being exposed in the first side area of the first region, and the second region except the pad area after removing the second metal layer in the step (6);

(7) depositing a transparent conductive layer on the substrate; and (8) patterning the transparent conductive layer so that the transparent conductive layer is formed on the drain electrode and the top electrode of the capacitor, and on the substrate between the transistor area and the capacitor area.

4. The method of claim 3 wherein the transparent conductive layer is made from indium tin oxide (ITO).

5. The method of claim 1 wherein the semiconductor layer is selected from an amorphous silicon layer and a polysilicon layer.

6. The method of claim 1 wherein the method further comprises:

forming an etching stopper in the transistor area after the semiconductor layer is formed in the step (3), the etching stopper being located between the semiconductor layer and the doped silicon layer; and removing the second metal layer and the doped silicon layer within the channel area for exposing the etching stopper in the channel area after the step (6).

* * * * *